United States Patent
Sommers

(10) Patent No.: US 6,798,136 B2
(45) Date of Patent: Sep. 28, 2004

(54) PHOSPHOR EMBEDDED DIE EPOXY AND LEAD FRAME MODIFICATIONS

(75) Inventor: Mathew L. Sommers, Sagamore Hills, OH (US)

(73) Assignee: GELcore LLC, Valley View, OH (US)

( * ) Notice: Subject to any disclaimer, the term of this patent is extended or adjusted under 35 U.S.C. 154(b) by 38 days.

(21) Appl. No.: 09/681,861

(22) Filed: Jun. 19, 2001

(65) Prior Publication Data

US 2002/0190641 A1 Dec. 19, 2002

(51) Int. Cl.[7] .................................................. H01J 1/62
(52) U.S. Cl. ...................... 313/512; 313/501; 313/502; 313/503; 313/499; 313/498; 313/509
(58) Field of Search ................................. 313/501, 502, 313/503, 499, 509, 512, 498; 362/800; 257/95, 98, 99, 100

(56) References Cited

U.S. PATENT DOCUMENTS

| | | | | |
|---|---|---|---|---|
| 4,893,169 A | * | 1/1990 | Rusch et al. | 257/92 |
| 4,897,711 A | * | 1/1990 | Blonder et al. | 257/48 |
| 5,130,761 A | * | 7/1992 | Tanaka | 257/88 |
| 5,660,461 A | * | 8/1997 | Ignatius et al. | 362/241 |
| 5,773,085 A | | 6/1998 | Inoue et al. | |
| 5,792,509 A | | 8/1998 | Lin et al. | |
| 5,813,752 A | | 9/1998 | Singer et al. | |
| 5,813,753 A | | 9/1998 | Vriens et al. | |
| 5,874,748 A | * | 2/1999 | Osawa | 257/91 |
| 5,874,803 A | | 2/1999 | Garbuzov et al. | |
| 5,961,678 A | * | 10/1999 | Pruette et al. | 55/485 |
| 5,998,925 A | * | 12/1999 | Shimizu et al. | 313/503 |
| 6,044,189 A | * | 3/2000 | Miller | 385/37 |
| 6,084,250 A | | 7/2000 | Justel et al. | |
| 6,274,924 B1 | * | 8/2001 | Carey et al. | 257/676 |
| 6,345,903 B1 | * | 2/2002 | Koike et al. | 362/249 |
| 6,469,322 B1 | * | 10/2002 | Srivastava et al. | 257/89 |
| 6,576,491 B1 | * | 6/2003 | Chang et al. | 438/106 |
| 6,616,862 B2 | * | 9/2003 | Srivastava et al. | 252/301.4 P |
| 2002/0084745 A1 | | 7/2002 | Wang et al. | |

* cited by examiner

Primary Examiner—Nimeshkumar D. Patel
Assistant Examiner—Holly Harper
(74) Attorney, Agent, or Firm—Fay, Sharpe, Fagan, Minnich & McKee, LLP

(57) ABSTRACT

A system for converting light from a first range of wavelengths to a second range of wavelengths includes a semiconductor die and a phosphor embedded epoxy contacting a first end of the semiconductor die. A frame contacts the phosphor embedded epoxy. The first and second ranges of wavelengths include blue/ultraviolet light and visible light, respectively.

10 Claims, 1 Drawing Sheet

PHOSPHOR EMBEDDED DIE EPOXY AND LEAD FRAME MODIFICATIONS

BACKGROUND OF INVENTION

The present invention relates to an ultraviolet ("UV")/blue light excitable, visible light emitting phosphor. It finds particular application in conjunction with light emitting devices comprising a UV/blue light emitting die used in conjunction with the UV/blue excitable, visible light emitting phosphor and will be described with particular reference thereto. It will be appreciated, however, that the invention is also amenable to other like applications.

The advent of UV and blue LEDs of GaN-based epitaxial structures allowed, for the first time, generating white light from an LED. Luminescent phosphor materials have, heretofore, been applied on top of the LED. The phosphor material partially transforms the UV/blue light into longer wavelength visible light.

As used herein, the term "UV/blue LED" means an LED emitting in the UV range, or in the blue range, or in both the UV and blue ranges of the electromagnetic spectrum.

Successful implementation of such a device is of course dependent upon the efficient conversion of UV/blue light into visible light of the desired wavelength and the subsequent efficient extraction of the generated visible light from the device.

However, the medium of the UV die in such devices is relatively lossy and, therefore, the phosphors only partially absorb the light from the LED. The unabsorbed light is partially reflected by the phosphor particles back in the direction of the LED, and partially transmitted through the phosphor layer, in both cases reducing the total possible visible light output.

In addition, visible light emitted by the phosphor may never leave the device, due to internal reflection and/or absorption at various locations within the device structure.

The present invention provides a new and improved apparatus and method which overcomes the above-referenced problems and others.

SUMMARY OF INVENTION

A light emitting device includes a nitride compound, for providing at least one of blue and ultraviolet emission. An epoxy, embedded with a phosphor, is mounted to the nitride compound. A frame includes a surface having an uneven portion contacting the epoxy.

In accordance with one aspect of the invention, the nitride compound includes one of binary compound materials, ternary compound materials, and quaternary compound materials.

In accordance with a more limited aspect of the invention, the nitride compound is one of a group II through group VI-nitride compound.

In accordance with an even more limited aspect of the invention, the nitride compound is a group III-nitride including GaN.

In accordance with another aspect of the invention, the nitride compound and the epoxy are mounted to a substrate.

In accordance with a more limited aspect of the invention, the substrate includes sapphire.

In accordance with another aspect of the invention, the uneven portion is a designed surface.

In accordance with another aspect of the invention, the phosphor converts the at least one of the blue and the ultraviolet emission from the nitride compound to a visible light, which is emitted from the frame.

In accordance with another aspect of the invention, the frame further includes a smooth portion. Substantially none of the phosphor embedded epoxy contacts the smooth portion.

One advantage of the present invention is that it converts relatively more UV/blue light to visible light.

Another advantage of the present invention is that it efficiently converts UV/blue light, which is emitted toward the bottom of an LED die, to visible light.

Another advantage of the present invention is that the surface area of the lead frame, which contacts the phosphor, is created to increase the conversion of UV/blue light to visible light and concurrently decrease die epoxy degradation, which in turn increases system reliability.

Still further advantages of the present invention will become apparent to those of ordinary skill in the art upon reading and understanding the following detailed description of the preferred embodiments.

BRIEF DESCRIPTION OF DRAWINGS

The invention may take form in various components and arrangements of components, and in various steps and arrangements of steps. The drawing is only for purposes of illustrating a preferred embodiment and is not to be construed as limiting the invention.

DETAILED DESCRIPTION

Figure 1:
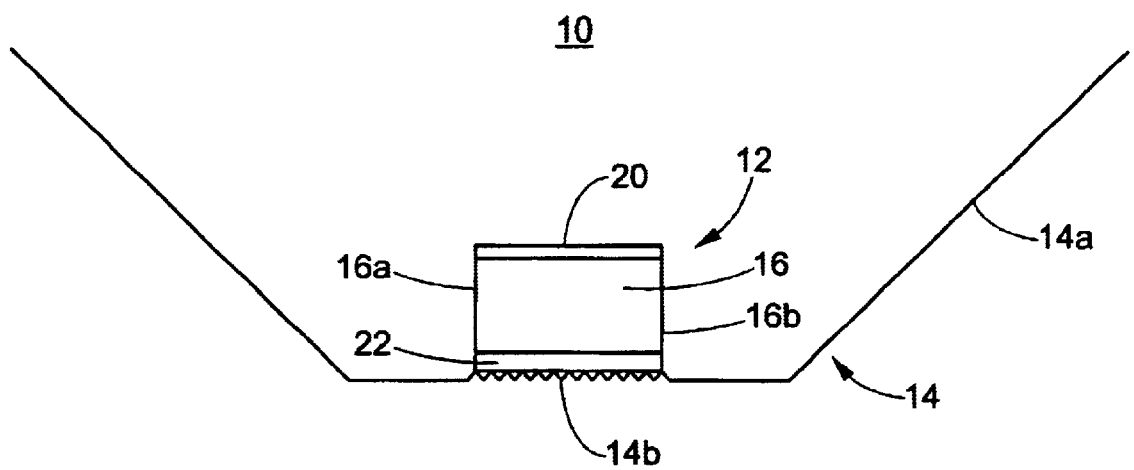
FIG. 1 illustrates a solid state light emitting device secured to a frame according to the present invention.

With reference to FIG. 1, a solid state light emitting device 10 includes a semiconductor die 12 and a frame 14.

The die 12 includes a substrate 16 (e.g., sapphire) and a nitride compound 20 mounted on a first end 16a of the substrate 16. Although a group III-nitride compound is preferred, it is to be understood that other compounds (e.g., group II-nitride compounds and/or group IV through group VI-nitride compounds are also contemplated). The compound 20 provides at least one of blue and ultraviolet emission (e.g., less than about 500 nanometers). An epoxy 22, which is embedded with a phosphor, is mounted on a second end 16b of the substrate 16. The phosphor embedded epoxy 22 contacts the frame 14. Optionally, epoxy, which may or may not be embedded with the phosphor, covers additional portions of the substrate 16.

The frame 14 includes two (2) portions 14a, 14b. The first portion 14a includes a smooth surface; the second portion 14b includes an uneven surface. The uneven surface 14b is designed to include, for example, ridges, grooves, dimples, and/or other shapes for creating a surface so as to direct UV light away from the die 12. The uneven designed surface increases the surface area of the second portion 14b of the frame 14. The phosphor embedded epoxy 22 contacts the designed surface 14b of the frame 14.

The group III-nitride compound 20 of the preferred embodiment includes binary compound materials of, for example, GaN, InN, AlN, ternary compound materials of, for example, $In_xGa_{1-x}N$, $Al_yGa_{1-y}N$, $In_zAl_{1-z}N$ and/or quaternary compound materials of, for example, $In_uAl_vGa_{1-u-v}N$, where u, v, x, y, and z are fractional numbers between zero (0) and (1) exclusive and u+v is a fractional number between zero (0) and (1) exclusive. Such group III-nitride compounds 20 are preferred as providing blue or ultraviolet emission (i.e., wavelengths below about 500 nm), having good reliability, and benefiting from a relatively mature processing technology. In the preferred embodiment, the group III-nitride compound 20 includes GaN. However, other materials are contemplated.

The phosphor embedded in the epoxy 22, which is between the substrate 16 and the second portion 14b of the frame 14, converts the emission from the group III-nitride compound 20 from a first range of wavelengths to a second range of wavelengths. More specifically, the phosphor converts blue/ultraviolet emission, which is within a first range of wavelengths greater than about 10 nanometers and less than about 500 nanometers, to a visible light, which is within a second range of wavelengths greater than about 400 nanometers and less than about 800 nanometers. The visible light is emitted from the designed portion 14b of the frame 14.

The light emitting device 10 of the present invention causes the blue/ultraviolet light, which is emitted toward the bottom of the die 12, to be efficiently transmitted through the phosphor material 22. Consequently, a greater proportion of the blue/ultraviolet light is converted to visible light over previous designs.

Electrode pads (electrical contacts) (not shown) on, for example, the group III-nitride compound 20 provide means for powering the semiconductor die 12.

The preferred embodiment has been described in terms of converting blue/ultraviolet light to visible light. However, it is to be understood that other embodiments, in which light is converted from one wavelength to another wavelength from a semiconductor die, are also contemplated.

The solid state light emitting device 10 is manufactured by mounting the phosphor embedded epoxy 22 to the second end 16b of the substrate 16. The first end 16a of the substrate 16 includes a group III-nitride, which provides at least one of blue and ultraviolet emission.

The designed surface 14b is created on the frame 14. Then, the second end of the semiconductor die 12 is mounted to the designed surface 14b via the phosphor embedded epoxy 22. Electrode pads (not shown) are connected to the semiconductor die 12.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light emitting device comprising:
  a substrate;
  a nitride compound, for providing at least one of blue and ultraviolet emission, mounted to a first surface of the substrate;
  an epoxy, embedded with a phosphor, mounted to a second surface of the substrate opposite the first surface; and
  a frame including an uneven portion that is a designed surface on which the substrate is mounted by the epoxy.

2. The light emitting device as set forth in claim 1, wherein the substrate includes sapphire.

3. The light emitting device as set forth in claim 1, wherein the nitride compound includes one of binary compound materials, ternary compound materials, and quaternary compound materials.

4. The light emitting device as set forth in claim 3, wherein the nitride compound is one of a group II through group VI-nitride compound.

5. The light emitting device as set forth in claim 4, wherein the nitride compound is a group III-nitride including GaN.

6. The light emitting device as set forth in claim 1, wherein the phosphor converts the at least one of the blue and the ultraviolet emission from the nitride compound to a visible light, which is emitted from the frame.

7. A light emitting device comprising:
  a nitride compound, for providing at least one of blue and ultraviolet emission;
  an epoxy, embedded with a phosphor, mounted to the nitride compound; and
  a frame including a surface having an uneven portion contacting the epoxy and a smooth portion, substantially none of the phosphor embedded epoxy contacting the smooth portion, and
  a substrate including:
    a first surface, the nitride compound being mounted to the first surface, and
    a second surface, opposing the first surface, the epoxy being mounted to the second surface to substantially cover the second surface.

8. A light emitting device, comprising:
  a nitride compound for providing at least one of blue and ultraviolet emission;
  a substrate having a first side on which the nitride compound is disposed;
  a frame including a roughened surface; and
  a phosphor containing epoxy disposed on a second side of the substrate opposite the first side and securing the substrate to the roughened surface of the frame.

9. The light emitting device as set forth in claim 8, wherein the substrate is sapphire.

10. The light emitting device as set forth in claim 8, wherein the nitride compound includes one of binary compound materials, ternary compound materials, and quaternary compound materials.

* * * * *